United States Patent
Lee et al.

(10) Patent No.: US 10,784,291 B2
(45) Date of Patent: Sep. 22, 2020

(54) PIXEL ARRAY SUBSTRATE

(71) Applicant: Au Optronics Corporation, Hsinchu (TW)

(72) Inventors: Ming-Hsien Lee, Hsinchu (TW); Che-Chia Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/533,781

(22) Filed: Aug. 6, 2019

(65) Prior Publication Data
US 2020/0052001 A1 Feb. 13, 2020

Related U.S. Application Data

(60) Provisional application No. 62/717,260, filed on Aug. 10, 2018.

(30) Foreign Application Priority Data

Mar. 28, 2019 (TW) .............................. 108111006 A

(51) Int. Cl.
H01L 27/12 (2006.01)
H01L 29/786 (2006.01)
(Continued)

(52) U.S. Cl.
CPC ........ H01L 27/124 (2013.01); G02F 1/13624 (2013.01); G02F 1/136286 (2013.01);
(Continued)

(58) Field of Classification Search
CPC .............. H01L 27/1222; H01L 27/124; H01L 27/1251; H01L 27/14623; H01L 27/14636;
(Continued)

(56) References Cited

U.S. PATENT DOCUMENTS 5,672,888 A * 9/1997 Nakamura ........ G02F 1/136213
257/408
9,337,214 B2 5/2016 Kubota et al.
(Continued)

FOREIGN PATENT DOCUMENTS

CN 106910748 6/2017
CN 107102485 8/2017
(Continued)

Primary Examiner — Stephen W Smoot
(74) Attorney, Agent, or Firm — JCIPRNET

(57) ABSTRACT

A pixel array substrate including a substrate, a first signal line, a second signal line, a third signal line, a first active element and a conductive pattern is provided. The first signal line and the second signal line are disposed on the substrate and intersect with each other. The third signal line is disposed on the substrate and overlapped with the second signal line. The extending direction of the third signal line is parallel to the extending direction of the second signal line. The first active element is electrically connected to the first signal line. The first active element includes a semiconductor pattern, a first gate and a second gate. The semiconductor pattern is located between the first gate and the second gate. The first gate is overlapped with the second gate and connected to the third signal line. The second gate is connected to the first gate via the conductive pattern.

19 Claims, 5 Drawing Sheets

(51) Int. Cl.
*H01L 23/532* (2006.01)
*H01L 29/423* (2006.01)
*H01L 27/146* (2006.01)
*G02F 1/1362* (2006.01)

(52) U.S. Cl.
CPC .... *H01L 23/53257* (2013.01); *H01L 27/1222* (2013.01); *H01L 27/1251* (2013.01); *H01L 27/14623* (2013.01); *H01L 27/14636* (2013.01); *H01L 29/42384* (2013.01); *H01L 29/78633* (2013.01); *H01L 29/78648* (2013.01); *H01L 29/78696* (2013.01); *G02F 2001/13629* (2013.01)

(58) Field of Classification Search
CPC ......... H01L 27/14641; H01L 29/78648; H01L 29/78675; H01L 29/78678; H01L 29/78696; G02F 1/136209; G02F 1/13624; G02F 1/136286; G02F 2001/13629; G02F 1/1368
See application file for complete search history.

(56) References Cited

U.S. PATENT DOCUMENTS

| | | | |
|---|---|---|---|
| 9,748,279 | B2 | 8/2017 | Kubota et al. |
| 10,108,054 | B2 | 10/2018 | Chang et al. |
| 10,559,602 | B2 | 2/2020 | Kubota et al. |
| 2012/0256184 | A1* | 10/2012 | Kaneko ............. H01L 29/78621 257/59 |
| 2013/0320345 | A1* | 12/2013 | Im ...................... H01L 21/02675 257/59 |
| 2015/0076492 | A1 | 3/2015 | Kubota et al. |
| 2016/0247827 | A1 | 8/2016 | Kubota et al. |
| 2017/0242306 | A1 | 8/2017 | Chang et al. |
| 2017/0352686 | A1 | 12/2017 | Kubota et al. |
| 2018/0286888 | A1* | 10/2018 | Yamaguchi ......... H01L 27/1222 |
| 2018/0286890 | A1* | 10/2018 | Suzumura ......... H01L 29/78648 |
| 2019/0004660 | A1* | 1/2019 | Guo ..................... H01L 23/3171 |
| 2019/0018292 | A1 | 1/2019 | Chang et al. |
| 2019/0302554 | A1* | 10/2019 | Chang ............... G02F 1/136286 |
| 2019/0363106 | A1 | 11/2019 | Kubota et al. |
| 2020/0052129 | A1* | 2/2020 | Miyake ............... H01L 29/4175 |
| 2020/0083256 | A1* | 3/2020 | Yoshida ................ G02F 1/1368 |
| 2020/0227496 | A1* | 7/2020 | Oh ....................... H01L 27/3262 |

FOREIGN PATENT DOCUMENTS

| | | |
|---|---|---|
| CN | 105047176 | 1/2018 |
| TW | 201128277 | 8/2011 |
| TW | 201514583 | 4/2015 |

* cited by examiner

PIXEL ARRAY SUBSTRATE

CROSS-REFERENCE TO RELATED APPLICATION

This application claims the priority benefits of U.S. provisional application Ser. No. 62/717,260, filed on Aug. 10, 2018, and Taiwan application serial no. 108111006, filed on Mar. 28, 2019. The entirety of each of the above-mentioned patent applications is hereby incorporated by reference herein and made a part of this specification.

BACKGROUND

Technical Field

The present invention relates to a pixel array substrate, and more particularly to a low-power consuming pixel array substrate.

Description of Related Art

With the popularity of the display panels, the display panels can be found on home TVs, e-sports screens, large outdoor billboards, public message screens in stores, and even portable or wearable electronic devices. In recent years, in addition to the pursuit of functionality and appearance, energy-saving devices have gradually become one of the key projects in product development. For example, a notebook computer that is dedicated to e-sports needs to be equipped with a high frame rate display panel. However, the power consumption of such high frame rate display panel is higher than that of a general display panel, such that the endurance of the notebook computer with the high frame rate display panel is reduced when it is powered by a battery.

In order to solve the above problem, the idea of the display screen to be locally updated has arisen, that is, the display panel can update the screen at different frequencies for the static image zone and the dynamic image zone of the display screen. For example, the pixel located in the static image zone can be driven by the update frequency of 1 Hz, and the pixel located in the dynamic image zone can be driven by the update frequency of 60 Hz, which can effectively reduce the power consumption of the display panel, thereby improving the endurance of the mobile device. However, this technology needs to be configured with an additional multiplex circuit on the display panel, which may decrease the aperture ratio of the pixel or reduce the layout space of the pixel circuit.

SUMMARY

The invention provides an energy-saving pixel array substrate, which has a good design margin of a driving circuit.

The pixel array substrate of the present invention includes a substrate, a first signal line, a second signal line, a third signal line, a first active element, and a conductive pattern. The first signal line and the second signal line are disposed on the substrate and intersect each other. The third signal line is disposed on the substrate. The extending direction of the third signal line is parallel to the extending direction of the second signal line. The third signal line is overlapped with the second signal line. The first active element is electrically connected to the first signal line. The first active element includes a semiconductor pattern, a first gate, and a second gate. The semiconductor pattern is located between the first gate and the second gate. The first gate is overlapped with the second gate and is connected to the third signal line. The second gate is connected to the first gate through the conductive pattern.

Based on the above, in the pixel array substrate of one embodiment of the present invention, the pixel structures connected to the same first signal line can be respectively driven at different update frequencies through the settings of the third signal line, the first gate and the second gate, which helps to reduce the power consumption of the pixel array substrate. Further, by overlapping the third signal line with the second signal line, the aperture ratio of the pixel structure and the layout space of the driving circuit can be increased. Moreover, in the first active element, the semiconductor pattern is interposed between the first gate and the second gate, thereby effectively improving the operating electrical properties of the active element.

In order to make the aforementioned features and advantages of the disclosure more comprehensible, embodiments accompanied with drawings are described in detail below.

DESCRIPTION OF THE EMBODIMENTS

Figure 1:
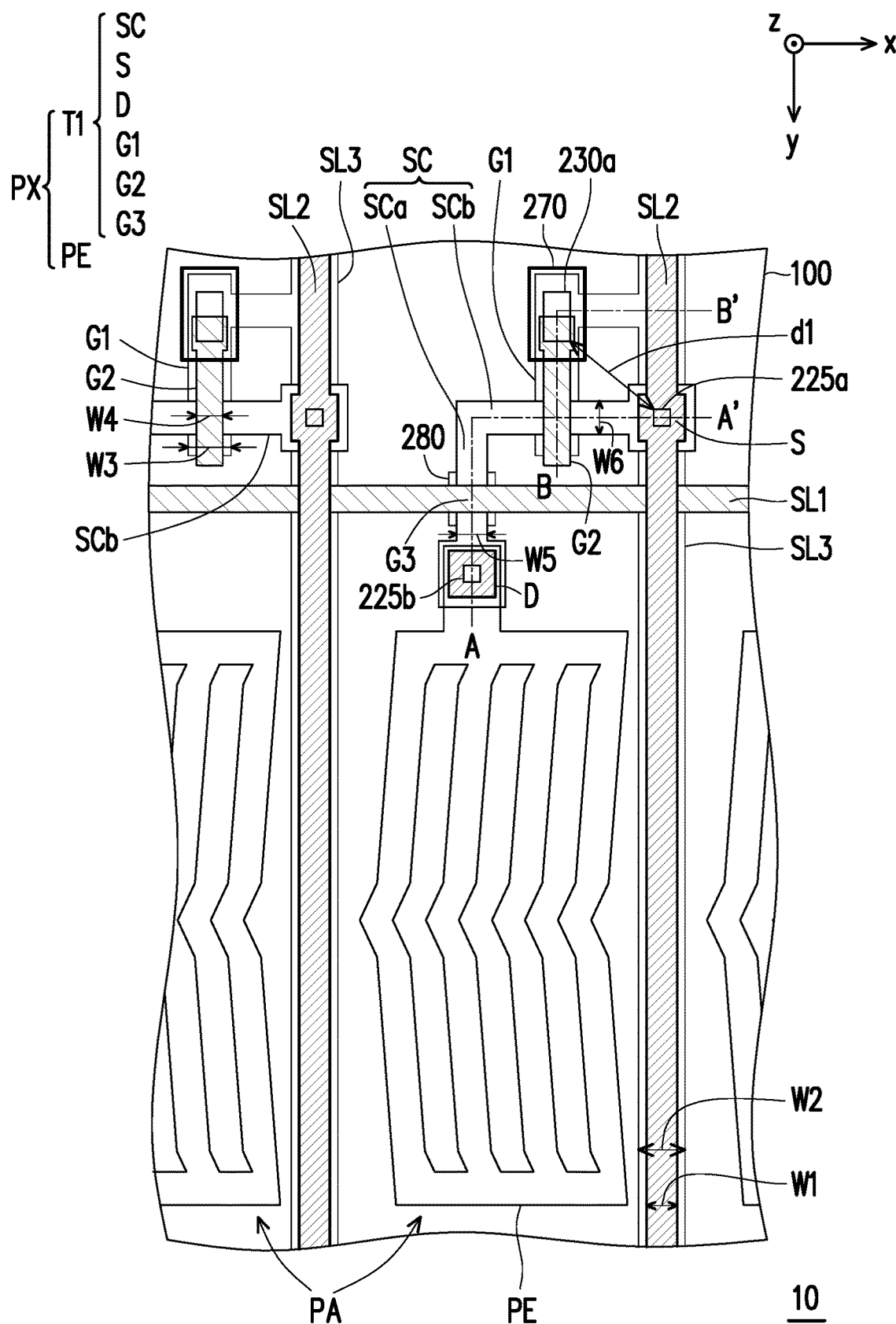
FIG. 1 is a top view of a pixel array substrate according to an embodiment of the present invention.

The term "about," "approximately," "essentially" or "substantially" as used herein is inclusive of the stated value and means within an acceptable range of deviation for the particular value as determined by those of ordinary skill in the art, considering the measurement in question and the error associated with measurement of the particular quantity (i.e., the limitations of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about," "approximately," "essentially" or "substantially" as used herein based on measuring properties, cutting properties or other properties, instead of applying one standard deviation across all the properties.

In the accompanying drawings, thicknesses of layers, films, panels, regions and so on are exaggerated for clarity. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Therefore, the electrical connection may be refer an intervening elements exist between two elements.

In the disclosure, to facilitate understanding, positions of a source and a drain in a transistor in the drawings are exemplary and not intended to be limiting. The reason is that the source and the drain in the transistor may change with current direction, or may differ depending on whether the transistor is an N-type transistor or a P-type transistor.

Reference will now be made in detail to the present preferred embodiments of the disclosure, examples of which are illustrated in the accompanying drawings. Wherever possible, the same reference numerals are used in the drawings and the description to refer to the same or like parts.

Figure 2:
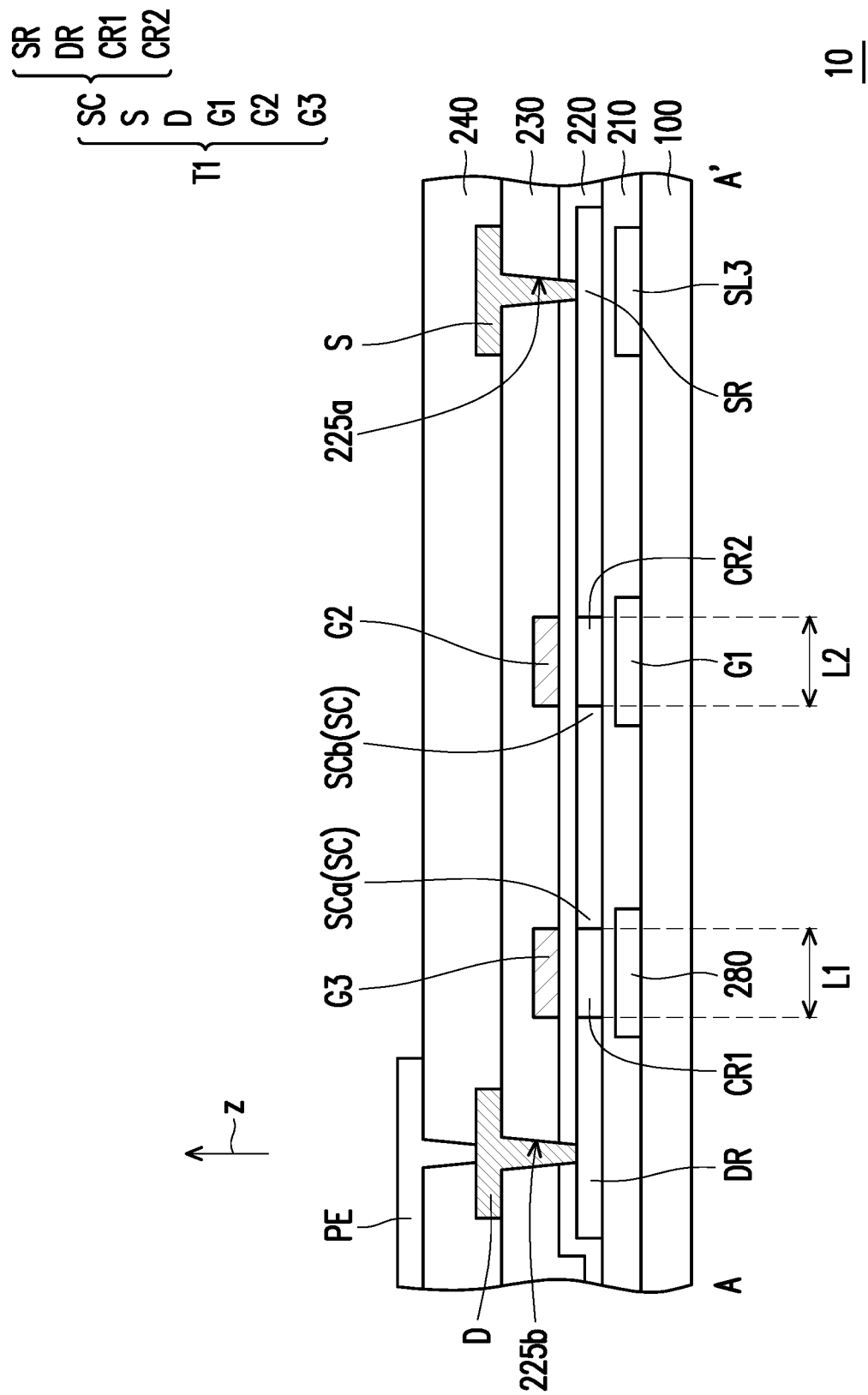
FIG. 2 and FIG. 3 are schematic cross-sectional views of two different positions on the pixel array substrate of FIG. 1.
Figure 3:
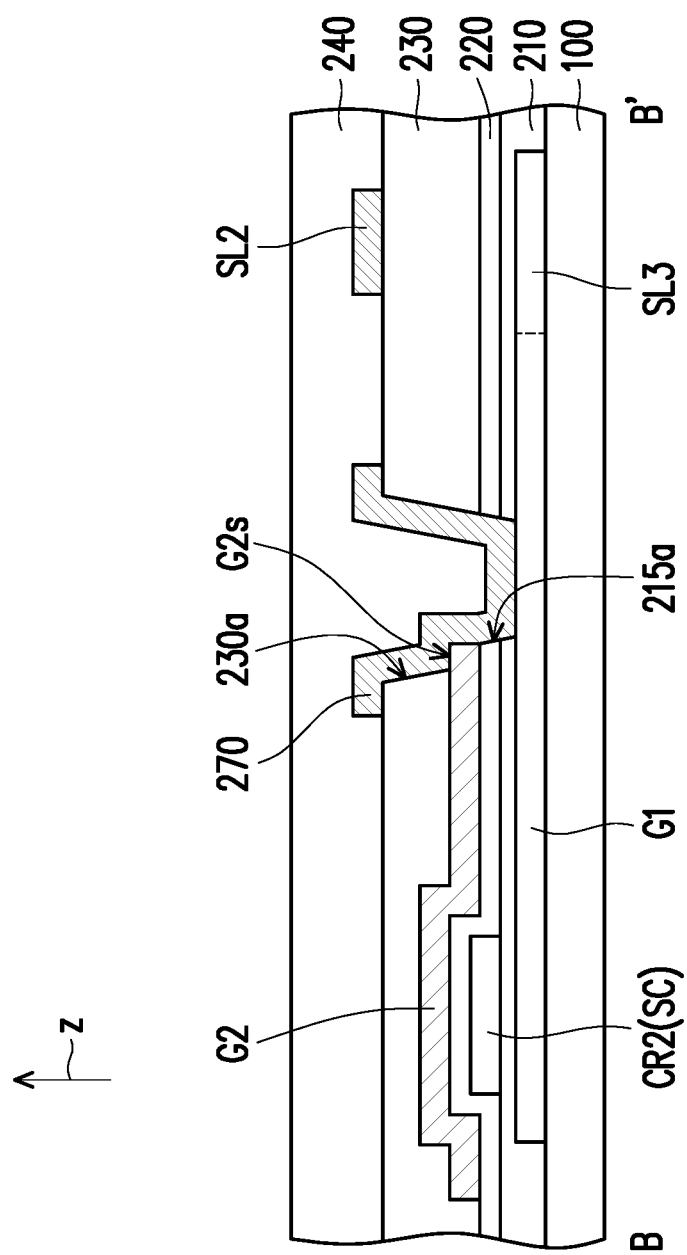

FIG. 1 is a top view of a pixel array substrate 10 according to an embodiment of the present invention. FIG. 2 and FIG. 3 are schematic cross-sectional views of two different positions on the pixel array substrate 10 of FIG. 1. FIG. 2 and FIG. 3 correspond to the sectional line A-A' and the sectional line B-B' of FIG. 1, respectively. It should be noted that the first insulating layer 210, the second insulating layer 220, the third insulating layer 230 and the fourth insulating layer 240 of FIG. 2 are omitted in FIG. 1 for clarity purposes.

In particular, the pixel array substrate of the present invention is applicable to a display panel, wherein the display panel further includes a display medium (e.g., a liquid crystal material layer, a luminescent material layer) disposed on the pixel array substrate, and driving electrode covering the display medium. For example, the pixel array substrates 10 and 20 of FIGS. 1 and 4 may be applied to a non-self-luminescent display panel, such as a liquid crystal display panel (LCD panel), and the pixel array substrate 30 of FIG. 5 may be applied to a self-luminescent display panel, such as an organic light emitting diode (OLED) panel, a micro-light emitting diode (Micro-LED) panel, and a mini-light emitting diode (Mini-LED) panel, but the invention is not limited thereto.

Referring to FIG. 1, the pixel array substrate 10 includes a substrate 100, a plurality of first signal lines SL1, and a plurality of second signal lines SL2. The first signal lines SL1 and the second signal lines SL2 are disposed on the substrate 100 and each first signal line SL1 and each second signal line SL2 intersect with each other. For example, in the present embodiment, the first signal line SL1 is, for example, a scan line, and the second signal line SL2 is, for example, a data line, and the extending direction of the first signal line SL1 (i.e., the direction x) may be substantially perpendicular to the extending direction of the second signal line SL2 (i.e., the direction y), but the invention is not limited thereto.

In the present embodiment, in consideration of conductivity, the first signal line SL1 and the second signal line SL2 are generally made of a metal material. However, the present invention is not limited thereto. According to other embodiments, the first signal line SL1 and the second signal line SL2 may also be made of other conductive materials, such as an alloy, a nitride of a metal material, an oxide of a metal material, an oxynitride of a metal material, other suitable materials, or a stacked layer of a metal material and said other conductive materials described above. It should be noted that the present invention does not limit the number of the first signal line SL1 and the second signal line SL2 by the content disclosed in the drawings. In some embodiments, the number of the first signal line SL1 and the second signal line SL2 may be adjusted depending on the actual design requirements.

Further, the adjacent two first signal lines SL1 cross over the adjacent two second signal lines SL2 to define one pixel area PA of the pixel array substrate 10. The pixel array substrate 10 further includes a plurality of pixel structures PX located in a plurality of pixel regions PA. Further, the pixel structure PX includes a first active element T1 and a pixel electrode PE. The first active element T1 is electrically connected to the corresponding first signal line SL1, the corresponding second signal line SL2 and the corresponding pixel electrode PE. In particular, the first active element T1 may serve as a charging (or discharging) switch of the pixel electrode PE. For example, when the first active element T1 is turned on, the charge transmitted on the second signal line SL2 can be transmitted to the pixel electrode PE via the first active element T1 (i.e., the pixel electrode PE is charged); or when the first active element T1 is turned on, the charge of the pixel electrode PE can be transmitted to the second signal line SL2 via the first active element T1 (i.e., the pixel electrode PE is discharged).

In this embodiment, the pixel electrode PE may be a transmissive electrode, and the material of the transmissive electrode may include a metal oxide, such as indium tin oxide (ITO), indium zinc oxide (IZO), aluminum tin oxide (ATO), aluminum zinc oxide (AZO), other suitable oxides, or a stacked layer of at least two of the aforesaid materials. However, the present invention is not limited thereto. In other embodiments, the pixel electrode PE may be a reflective electrode, and the material of the reflective electrode may include metal, an alloy, a nitride of a metal material, an oxide of a metal material, an oxynitride of a metal material, other suitable materials, or a stacked layer of a metal material and the aforesaid conductive materials.

Referring to FIG. 1 and FIG. 2, the pixel array substrate 10 further includes a plurality of third signal lines SL3 disposed corresponding to the plurality of pixel structures PX, respectively. The third signal lines SL3 are arranged side by side and located on the substrate 100, and the extending direction of each third signal line SL3 may be parallel to the extending direction of each second signal line SL2. In particular, each of the third signal lines SL3 overlaps the corresponding second signal line SL2 in the normal direction z perpendicular to the substrate 100, which helps to reduce the layout space of the pixel driving circuit.

In this embodiment, the second signal line SL2 may completely overlap the corresponding third signal line SL3 in the normal direction z perpendicular to the substrate 100, and the width W1 of the second signal line SL2 in the direction x may be smaller than the width W2 of the third signal line SL3 in the direction x. That is, the vertical projection area of the second signal line SL2 on the substrate 100 may be smaller than the vertical projection area of the third signal line SL3 on the substrate 100, but the invention is not limited thereto. In some embodiments, the second signal line SL2 may partially overlap the corresponding third signal line SL3 in the normal direction z perpendicular to the substrate 100. In some other embodiments, the width W1 of the second signal line SL2 in the direction x and the width W2 of the third signal line SL3 in the direction x may be substantially equal. Moreover, in the present embodiment, in order to increase the subsequent process latitude, the material of the third signal line SL3 may include molybdenum, molybdenum oxide, or other alloy containing molybdenum.

Further, the first active element T1 includes a semiconductor pattern SC, a source S, a drain D, a first gate G1, and a second gate G2. The source S and the drain D are electrically connected to the second signal line SL2 and the pixel electrode PE, respectively. In this embodiment, the source S may be a part of the second signal line SL2, but the invention is not limited thereto. In addition, the first gate G1 and the second gate G2 are electrically connected to the third signal line SL3. The first gate G1 overlaps the second gate G2 in the normal direction z perpendicular to the substrate 100, and the semiconductor pattern SC is located between the first gate G1 and the second gate G2. In this embodiment, the first active element T1 may further include a third gate G3 connected to the first signal line SL1, and the third gate G3 may be disposed above the semiconductor pattern SC, but the present invention is not limited thereto. In other embodiments, the third gate G3 may be disposed under the semiconductor pattern SC.

Since the first active element T1 has the first gate G1 and the second gate G2 both electrically connected to the third signal line SL3 and the third gate G3 electrically connected to the first signal line SL1, in the pixel array substrate 10, the first active element T1 can be turned on through the first signal line SL1 and the third signal line SL3, so as to charge or discharge the pixel electrode PE. On the other hand, in the pixel array substrate 10, the first active element T1 can be turned off through at least one of the first signal line SL1 and the third signal line SL3, so that the pixel electrode PE stops charging or discharging.

For example, the pixel structures PX connected to the same first signal line SL1 (e.g., a scan line) include a first pixel structure and a second pixel structure. During a scan period, when the third gate G3 of the first pixel structure and the third gate G3 of the second pixel structure are applied with a positive bias through the same first signal line SL1, the first gate G1 and the second gate G2 of the first pixel structure are applied with another positive bias through the corresponding third signal line SL3, so that the pixel electrode PE of the first pixel structure is charged or discharged through the corresponding second signal line SL2; at the same time, the first gate G1 and the second gate G2 of the second pixel structure are applied with a negative bias through the corresponding third signal line SL3, so that the pixel electrode PE of the second pixel structure cannot be charged or discharged through the corresponding second signal line SL2.

In other words, the pixel structures PX connected to the same first signal line SL1 can be respectively charged (or discharged) at different update frequencies through the settings of the first gate G1, the second gate G2 and the third signal line SL3. For example, a portion of the pixel structures PX can be driven at an update frequency of 60 Hz, while another portion of the pixel structures PX can be driven at an update frequency of 1 Hz. As a result, the power consumption of the pixel array substrate is able to be reduced. Moreover, the first active element T1 includes the first gate G1 and the second gate G2 disposed on the upper and lower sides of the semiconductor pattern SC, so that the leakage current generated when the active element is turned off can be effectively reduced.

Referring to FIG. 2, in the embodiment, the method for forming the first active element T1 may include the steps of sequentially forming the first gate G1, the first insulating layer 210, the semiconductor pattern SC, the second insulating layer 220, the second gate G2 and the third gate G3, the third insulating layer 230, the source S and the drain D on the substrate 100. The semiconductor pattern SC includes a first channel region CR1, a second channel region CR2, a source region SR, and a drain region D formed by performing the ion doping process with the second gate G2 and the third gate G3 as masks. The second gate G2 and the second channel region CR2 are overlapped with each other in the normal direction z perpendicular to the substrate 100. The third gate G3 and the first channel region CR1 overlapped with each other in the normal direction z perpendicular to the substrate 100. The source region SR overlaps the third signal line SL3 in the normal direction z perpendicular to the substrate 100. The source S is electrically connected to the source region SR through a contact window 225a formed in the second insulating layer 220 and the third insulating layer 230, and the drain D is electrically connected to the drain region DR through a contact window 225b formed in the second insulating layer 220 and the third insulating layer 230. However, the invention is not limited thereto.

In the present embodiment, the semiconductor pattern SC, the first insulating layer 210, the second insulating layer 220, the third insulating layer 230, the first gate G1, the second gate G2, the third gate G3, the source S and the drain D may each be implemented by any semiconductor pattern, any insulating layer, any gate, any source and any drain for the pixel array substrate well known to those of ordinary skill in the art. And, the semiconductor pattern SC, the first insulating layer 210, the second insulating layer 220, the third insulating layer 230, the first gate G1, the second gate G2, the third gate G3, the source S and the drain D may each be formed by any method known to those of ordinary skill in the art. In particular, in the present embodiment, the first insulating layer 210, the second insulating layer 220, the third insulating layer 230, and the fourth insulating layer 240 may respectively be a buffer layer, a gate insulating layers, an interlayer insulating layer and a planarization layer, but the invention is not limited thereto.

As seen from FIG. 2 and FIG. 3, in the present embodiment, the materials of the first gate G1 and the third signal line SL3 may be the same, and the materials of the source S, the drain D, and the second signal line SL2 may be the same. That is, the first gate G1 and the third signal line SL3 may be formed in the same layer, and the source S, the drain D and the second signal line SL2 may be formed in the same layer, but the invention is not limited thereto. In some embodiments, the third signal line SL3, the second gate G2 and the third gate G3 may belong to the same layer.

As seen from FIG. 1 and FIG. 2, the materials of the second gate G2, the third gate G3 and the first signal line SL1 may be the same. That is, the second gate G2, the third gate G3 and the first signal line SL1 may be formed in the same layer. However, the present invention is not limited thereto. According to other embodiments, the first signal line SL1 and the first gate G1 may belong to the same layer. In particular, in the present embodiment, the third gate G3 may be a part of the first signal line SL1, and the source S may be a part of the second signal line SL2, but the invention is not limited thereto.

Referring to FIG. 3, the method for forming the first active element T1 further includes the steps of forming a contact window 230a and a contact window 215a in the first insulating layer 210, the second insulating layer 220 and the third insulating layer 230, and forming a conductive pattern 270 on the third insulating layer 230. The first gate G, the second gate G2 and the conductive pattern 270 are overlapped with each other in the normal direction z perpendicular to the substrate 100. For example, the conductive pattern 270 may extend from the third insulating layer 230 to fill into the contact window 230a and the contact window 215a to be electrically connected to the first gate G1 and the second gate G2. More specifically, in the embodiment, the conductive pattern 270 directly contacts the first gate G1 and the second gate G2. In other words, the first gate G1 and the second gate G2 are electrically connected to each other through the conductive pattern 270. Moreover, the pixel array substrate 10 may further include the fourth insulating layer 240 covering the source S, the drain D, the second signal line SL2, the conductive pattern 270 and the third insulating layer 230. The pixel electrode PE is disposed on the fourth insulating layer 240 and extends through the fourth insulating layer 240 to electrically connect the drain D of the first active element T1 (as shown in FIG. 2).

In the present embodiment, in consideration of conductivity, the conductive pattern 270 is generally made of a metal material. However, the present invention is not limited thereto. According to other embodiments, the conductive pattern 270 may be made of other conductive materials, such as an alloy, a nitride of a metal material, an oxide of a metal material, an oxynitride of a metal material, other suitable materials, or a stacked layer of a metal material and said other conductive materials described above. As shown in FIG. 3, in the embodiment, the materials of the conductive pattern 270 and the second signal line SL2 may be the same. That is, the conductive pattern 270 and the second signal line SL2 may be formed in the same layer, but the invention is not limited thereto.

It is worth mentioning that during an etching process (for example, a wet etching process) of forming the contact window 230a and the contact window 215a, the third insulating layer 230 is etched by the etchant to form the contact window 230a and expose a portion of the upper surface G2s of the second gate G2. Due to the material of the second gate G2 is different from the materials of the first insulating layer 210, the second insulating layer 220, and the third insulating layer 230, the second gate G2 is less etched by the etchant than the first insulating layer 210, the second insulating layer 220 and the third insulating layer 230, and thus the contact window 230a may partially overlap the upper surface G2s of the second gate G2 in the normal direction z perpendicular to the substrate 100 (as shown in FIG. 3), and the vertical projection of the region occupied by the contact window 215a formed by etching the first insulating layer 210 and the second insulating layer 220 using the etchant on the substrate 100 is located within the vertical projection of the region occupied by the contact window 230a on the substrate 100.

As shown in FIG. 1, in this embodiment, the semiconductor pattern SC may have a first segment SCa and a second segment SCb, and the second segment SCb is connected between the first segment SCa and the second signal line SL2. The third gate G3 may be overlapped with the first segment SCa in the normal direction z perpendicular to the substrate 100, and the first gate G1 and the second gate G2 both may be overlapped with the second segment SCb in the normal direction z perpendicular to the substrate 100. In other words, the first channel region CR1 and the second channel region CR2 of the semiconductor pattern SC are respectively located in the first segment SCa and the second segment SCb.

Referring to FIG. 1 and FIG. 2, the first channel region CR1 has a first length L1 in the extending direction of the first segment SCa (i.e., the direction y), and the second channel region CR2 has a second length L2 in the extending direction of the second segment SCb (i.e., the direction x). In this embodiment, the first length L1 of the first channel region CR1 may be equal to the second length L2 of the second channel region CR2. In other words, the ratio of the second length L2 of the second channel region CR2 to the first length L1 of the first channel region CR1 is substantially 1. From another point of view, since the channel region of the semiconductor pattern SC (for example, the first channel region CR1 and the second channel region CR2) is formed by performing the ion doping process with the gate (for example, the second gate G2 and the third gate G3) as mask, so the length of the channel region may be substantially equal to the width of the gate. In other words, in the present embodiment, the width of the second gate G2 in the direction x may be equal to the width of the third gate G3 in the direction y. Moreover, the first segment SCa of the semiconductor pattern SC has a width W5 in the direction x, the second segment SCb has a width W6 in the direction y, and the width W5 of the first segment SCa may be equal to the width W6 of the second segment SCb. In other words, the ratio of the width W6 of the second segment SCb to the width W5 of the first segment SCa is substantially 1.

Further, in order to increase the aperture ratio of the pixel structure PX (or the layout space of the driving circuit) and avoid short circuit between the driving lines, in some embodiments, the shortest distance d1 between the vertical projection of the region occupied by the contact window 230a on the substrate 100 and the vertical projection of the region occupied by the contact window 225a on the substrate 100 may be in the range of 2.25 μm to 6 μm. In the present embodiment, in order to prevent the semiconductor pattern SC from degrading under the long-time illumination of the backlight to improve the reliability of the active element, the pixel array substrate 10 may further include a light shielding pattern 280. The light shielding pattern 280 is located between the substrate 100 and the semiconductor pattern SC. In the present embodiment, the light shielding pattern 280 may be overlapped with the first channel region CR1 of the semiconductor pattern SC in the normal direction z perpendicular to the substrate 100.

It is worth mentioning that, in this embodiment, the first gate G1 has a width W3 in the extending direction of the second segment SCb (i.e., the direction x), the second gate G2 has a width W4 in the extending direction of the second segment SCb (i.e., the direction x), and the width W3 of the first gate G1 may be greater than the width W4 of the second gate G2, so that the second channel region CR2 of the semiconductor pattern SC can be prevented from degrading under the long-time illumination of the backlight to improve the reliability of the active element. However, the present invention is not limited thereto. In some embodiments, the width W3 of the first gate G1 may be substantially equal to the width W4 of the second gate G2. In this embodiment, the materials of the light shielding pattern 280, the first gate G1 and the third signal line SL3 may be the same. That is, the light shielding pattern 280, the first gate G1 and the third signal line SL3 may be belong to the same layer, but the invention is not limited thereto.

In the following, other embodiments will be described to explain the present invention in detail, in which the same components will be denoted by the same reference numerals, and the description of the same technical content will be omitted. For the omitted part of the description, please refer to the foregoing embodiments, and details are not described below.

Figure 4:
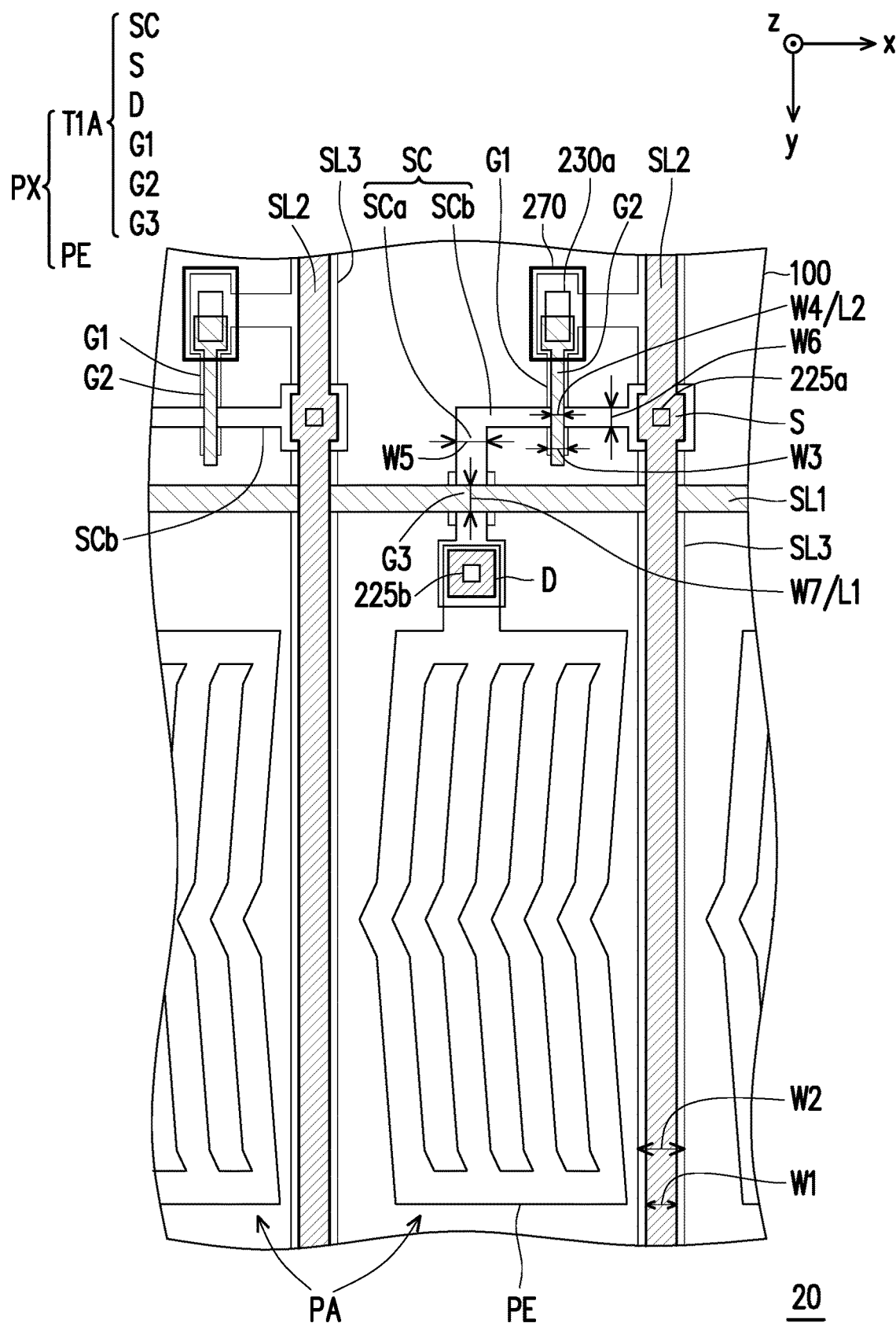
FIG. 4 is a top view of a pixel array substrate according to another embodiment of the present invention.

FIG. 4 is a top view of a pixel array substrate 20 according to another embodiment of the present invention. Referring to FIG. 4, the pixel array substrate 20 of the present embodiment differs from the pixel array substrate 10 of FIG. 1 in that: in the pixel array substrate 20, the width W3 of the first gate G1 and the width W4 of the second gate G2 are smaller than the width W7 of the third gate G3. From another point of view, in the pixel array substrate 20, the second length L2 of the second channel region of the semiconductor pattern SC (i.e., the region where the semiconductor pattern SC overlaps the second gate G2) may be smaller than the first length L1 of the first channel region of the semiconductor pattern SC (i.e., a region in which the semiconductor pattern SC overlaps the third gate G3). Specifically, in the present embodiment, the ratio of the second length L2 of the second channel region to the first length L1 of the first channel region may be between 0.5 and less than 1. Moreover, in the pixel array substrate 20, the width W6 of the second segment SCb of the semiconductor pattern SC may be smaller than the width W5 of the first segment SCa. Specifically, in the present embodiment, the ratio of the width W6 of the second segment SCb to the width W5 of the first segment SCa may be between 0.5 and less than 1.

Further, the first active element T1A includes the first gate G1 and the second gate G2 disposed on the upper and lower sides of the semiconductor pattern SC, so that the operating electrical properties of the active element can be effectively improved, for example, the leakage current generated when the active element is turned off can be reduced, and the driving current of the active element when it is turned on can be increased. Therefore, from another point of view, the design margin of the active element can be increased, for example, the width of the gate in the extending direction of the semiconductor pattern (i.e., the length of the channel region) can be shortened, and the width of the semiconductor pattern (i.e., the width of the channel region) can be reduced. As such, the aperture ratio of the pixel structure PX or the layout space of the driving circuit can be increased.

Figure 5:
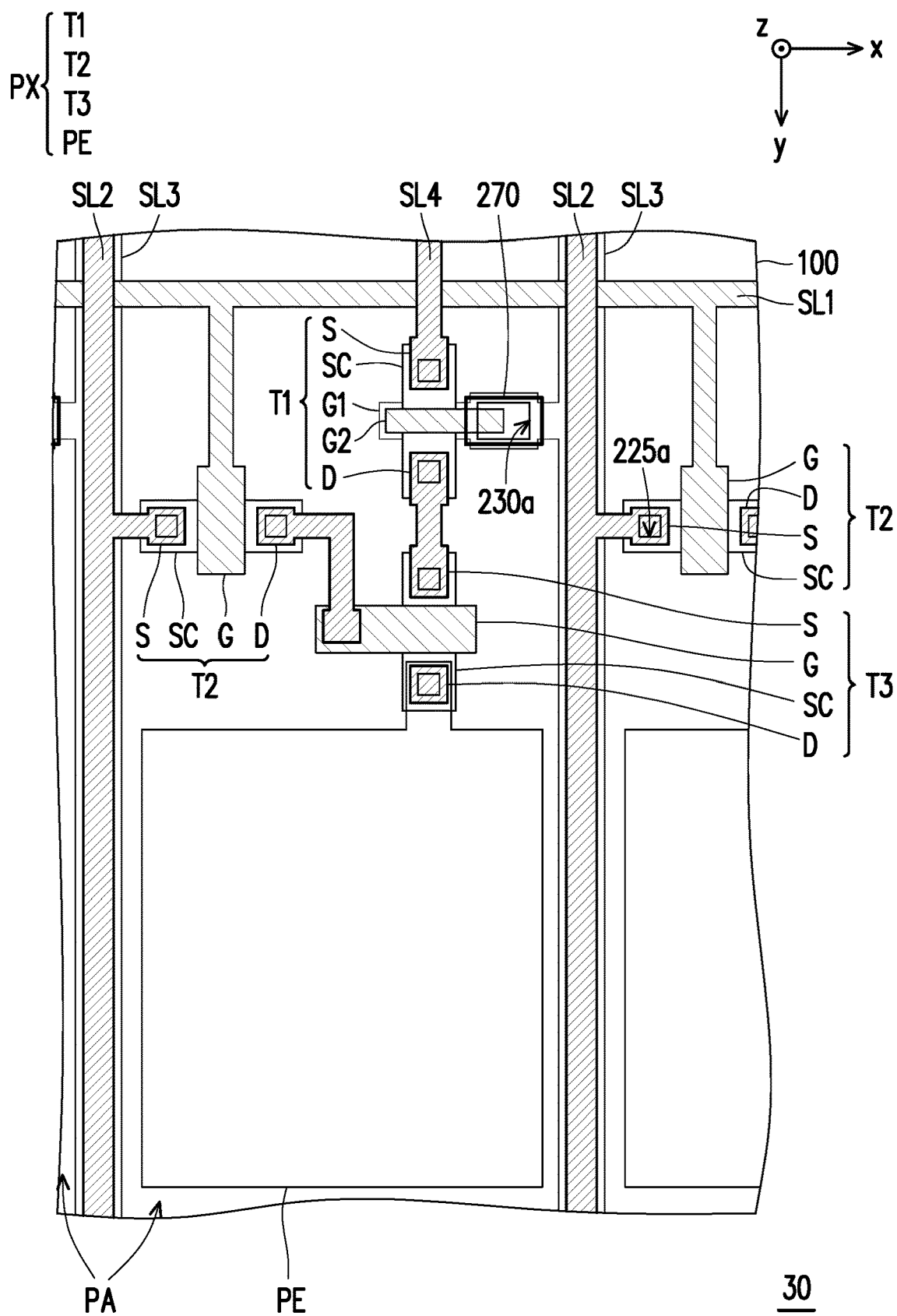
FIG. 5 is a top view of a pixel array substrate according to still another embodiment of the present invention.

FIG. 5 is a top view of a pixel array substrate 30 according to still another embodiment of the present invention. Referring to FIG. 5, the difference between the pixel array substrate 30 of the present embodiment and the pixel array substrate 10 of FIG. 1 mainly lies in: the number of the gates of the first active element T1 of the pixel array substrate 30 is two (i.e., the first gate G1 and the second gate G2), and each pixel structure PX further includes a second active element T2, a third active element T3 and a fourth signal line SL4. It should be noted that the present invention does not limit the number of pixel structures and signal lines by the content disclosed in the drawings. In some embodiments, the number of pixel structures and signal lines may be adjusted according to different design requirements.

In the embodiment, the third active element T3 is electrically connected between the first active element T1 and the pixel electrode PE, and the second active element T2 is electrically connected to the first signal line SL1, the second signal line SL2 and the third active element T3. In detail, the source S and the drain D of the first active element T1 are respectively electrically connected to the fourth signal line SL4 and the source S of the third active element T3, the drain D and the gate G of the third active element T3 are respectively electrically connected to the pixel electrode PE and the drain D of the second active element T2, and the source S and the gate G of the second active element T2 are respectively electrically connected to the second signal line SL2 and the first signal line SL1.

In particular, in the pixel array substrate 30, the second signal line SL2 and the third signal line SL3 electrically connected to the same pixel structure PX are respectively located on opposite sides of that pixel structure PX, which differs from the pixel array substrate 10 and 20 of the foregoing embodiments. In detail, in the pixel array substrate 30, the source S of the second active element T2 and the first gate G1 (or the second gate G2) of the first active element T1 located in the same pixel region PA are respectively electrically connected to the second signal line SL2 and the third signal line SL3. From another point of view, the third signal line SL3 electrically connected to the first active element T1 of one of the two adjacent pixel structures PX and the second signal line SL2 electrically connected to the second active element T2 of another one of the two adjacent pixel structures PX are overlapped with each other in the normal direction z perpendicular to the substrate 100.

In this embodiment, the fourth signal line SL4 may have a high voltage level, and in the pixel array substrate 30, the second active element T2, the third active element T3 and the first active element T1 can be turned on through the first signal line SL1, the second signal line SL2 and the third signal line SL3, so that the driving current transmitted by the fourth signal line SL4 flows into the pixel electrode PE to drive the display medium (not shown) disposed on the pixel electrode PE, the display medium is, for example, a luminescent material layer. Moreover, in the pixel array substrate 30, at least one of the first active element T1, the second active element T2 and the third active elements T3 can be turned off through at least one of the first signal line SL1, the second signal line SL2 and the third signal line SL3, so that the driving current transmitted by the fourth signal line SL4 is prevented from flowing into the pixel electrode PE.

For example, the pixel structures PX connected to the same first signal line SL1 (e.g., a scan line) include a first pixel structure and a second pixel structure. During a scan period, when the gate G of the second active element T2 of the first pixel structure and the gate G of the second active element T2 of the second pixel structure are applied with a positive bias through the same first signal line SL1, the gate G of the third active element T3 of the first pixel structure and the gate G of the third active element T3 of the second pixel structure are respectively applied with another positive bias through the corresponding second signal lines SL2. At this time, the first gate G1 and the second gate G2 of the first pixel structure can be applied with another positive bias through the corresponding third signal line SL3 to allow the driving current transmitted by the corresponding fourth signal line SL4 to flow into the pixel electrode PE of the first pixel structure; while the first gate G1 and the second gate G2 of the second pixel structure can be applied with a negative bias through the corresponding third signal line SL3 to not allow the driving current transmitted by the corresponding fourth signal line SL4 to flow into the pixel electrode PE of the second pixel structure.

In other words, the pixel structures PX connected to the same first signal line SL1 can be respectively charged (or discharged) at different update frequencies through the settings of the first gate G1, the second gate G2 and the third signal line SL3. For example, a portion of the pixel structures PX can be driven at an update frequency of 60 Hz, while another portion of the pixel structures PX can be driven at an update frequency of 1 Hz. As a result, the power consumption of the pixel array substrate is able to be reduced.

In this embodiment, each pixel structure PX is exemplarily illustrated by taking the architecture of three active elements (i.e., 3T) as an example, and does not represent that the present invention is limited thereto. In other embodiments, each pixel structure PX may be a 1T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture or any possible architectures.

In summary, in the pixel array substrate of one embodiment of the present invention, the pixel structures connected to the same first signal line can be respectively driven at different update frequencies through the settings of the third signal line, the first gate and the second gate, which helps to reduce the power consumption of the pixel array substrate. Further, by overlapping the third signal line with the second signal line, the aperture ratio of the pixel structure and the layout space of the driving circuit can be increased. Moreover, in the first active element, the semiconductor pattern is interposed between the first gate and the second gate, thereby effectively improving the operating electrical properties of the active element.

Although the disclosure has been described with reference to the above embodiments, it will be apparent to those of ordinary skill in the art that modifications to the described embodiments may be made without departing from the spirit of the disclosure. Accordingly, the scope of the disclosure will be defined by the attached claims and not by the above detailed descriptions.

What is claimed is:

1. A pixel array substrate, comprising:
   a substrate;
   a first signal line and a second signal line are disposed on the substrate, wherein the first signal line intersects the second signal line;
   a third signal line disposed on the substrate, wherein the third signal line intersects the first signal line, and in a normal direction perpendicular to the substrate, the second signal line is overlapped with the third signal line;
   a first active element comprising a semiconductor pattern, a first gate, and a second gate, wherein the semiconductor pattern is located between the first gate and the second gate, and the second gate is overlapped with the first gate, and the first gate is electrically connected to the third signal line; and
   a conductive pattern electrically connected to the first gate and the second gate, wherein the conductive pattern, the first gate and the second gate are overlapped with each other in the normal direction.

2. The pixel array substrate of claim 1, wherein the first active element further comprises a third gate electrically connected to the first signal line, and the semiconductor pattern is electrically connected to the second signal line.

3. The pixel array substrate of claim 2, wherein the semiconductor pattern has a first segment extending in a first direction and a second segment extending in a second direction, wherein in the normal direction, the first segment is overlapped with the third gate, and the second segment is overlapped with the first gate and the second gate.

4. The pixel array substrate of claim 3, wherein the first segment of the semiconductor pattern has a first channel region, and the second segment of the semiconductor pattern has a second channel region, the first channel region has a first length in the first direction, the second channel region has a second length in the second direction, and a ratio of the second length to the first length is between 0.5 and 1.

5. The pixel array substrate of claim 3, wherein the first segment has a first width perpendicular to the first direction, and the second segment has a second width perpendicular to the second direction, and a ratio of the second width to the first width is between 0.5 and 1.

6. The pixel array substrate of claim 3, wherein the first gate has a first width in the second direction, and the second gate has a second width in the second direction, and the first width is greater than the second width.

7. The pixel array substrate of claim 1, wherein the semiconductor pattern is overlapped with the second signal line and the third signal line in the normal direction, the semiconductor pattern is located between the second signal line and the third signal line, and the semiconductor pattern is electrically connected to the second signal line.

8. The pixel array substrate of claim 1, further comprising:
   a first insulating layer disposed between the first gate and the semiconductor pattern; and
   a second insulating layer disposed between the second gate and the semiconductor pattern, wherein a first contact window is disposed in the first insulating layer and the second insulating layer, and the first contact window is overlapped with the first gate.

9. The pixel array substrate of claim 8, further comprising:
   a third insulating layer disposed on the second gate and covering a portion of a surface of the second gate, wherein a second contact window is disposed in the third insulating layer, the second contact is overlapped with the first gate and the second gate, and the conductive pattern extends from the third insulating layer to fill into the second contact window and the first contact window and contacts the first gate and the second gate.

10. The pixel array substrate of claim 9, wherein the first contact window does not align with the second contact window.

11. The pixel array substrate of claim 9, wherein a third contact window is disposed in the second insulating layer and the third insulating layer, and a portion of the second signal line is filled with the third contact window to electrically connect to the semiconductor pattern.

12. The pixel array substrate of claim 11, wherein a shortest distance between a vertical projection of a region occupied by the first contact window on the substrate and a vertical projection of a region occupied by the third contact window on the substrate is between 2.25 μm and 6 μm.

13. The pixel array substrate of claim 1, further comprising a second active element, wherein the first active element and the second active element are respectively located on opposite sides of the second signal line, and the second active element is electrically connected to the first signal line and the second signal line.

14. The pixel array substrate of claim 1, wherein a vertical projection area of the second signal line on the substrate is smaller than a vertical projection area of the third signal line on the substrate.

15. The pixel array substrate of claim 1, further comprising a light shielding pattern located between the semiconductor pattern and the substrate, wherein the light shielding pattern and the third signal line belong to the same layer.

16. The pixel array substrate of claim 1, wherein the conductive pattern and the second signal line belong to the same layer.

17. The pixel array substrate of claim 1, wherein the first gate and the third signal line belong to the same layer.

18. The pixel array substrate of claim 1, wherein the second gate and the first signal line belong to the same layer.

19. The pixel array substrate of claim 1, wherein the material of the third signal line comprises molybdenum and molybdenum oxide.

* * * * *